(12) United States Patent
Mazzocco et al.

(10) Patent No.: US 11,361,950 B2
(45) Date of Patent: Jun. 14, 2022

(54) MULTI-CATHODE PROCESSING CHAMBER WITH DUAL ROTATABLE SHIELDS

(71) Applicant: APPLIED MATERIALS, INC., Santa Clara, CA (US)

(72) Inventors: John Joseph Mazzocco, San Jose, CA (US); Cory Eugene Lafollett, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/849,910

(22) Filed: Apr. 15, 2020

(65) Prior Publication Data

US 2021/0327692 A1 Oct. 21, 2021

(51) Int. Cl.
*H01J 37/34* (2006.01)
*C23C 14/34* (2006.01)

(52) U.S. Cl.
CPC ...... *H01J 37/3441* (2013.01); *C23C 14/3407* (2013.01); *C23C 14/3464* (2013.01); *H01J 37/3405* (2013.01); *H01J 37/3417* (2013.01); *H01J 37/3447* (2013.01); *H01J 2237/20214* (2013.01); *H01J 2237/332* (2013.01)

(58) Field of Classification Search
None
See application file for complete search history.

(56) References Cited

U.S. PATENT DOCUMENTS

| 3,864,239 A | 2/1975 | Fletcher et al. | |
| 4,952,295 A | 8/1990 | Kawabata et al. | |
| 6,051,113 A * | 4/2000 | Moslehi | C23C 14/568 118/719 |
| 9,997,339 B2 * | 6/2018 | Ishihara | H01J 37/3429 |
| 2009/0211897 A1 * | 8/2009 | Tsunekawa | H01J 37/3447 204/192.13 |
| 2012/0164354 A1 | 6/2012 | Otani et al. | |
| 2014/0054167 A1 * | 2/2014 | Kajihara | C23C 14/3464 204/298.11 |

(Continued)

FOREIGN PATENT DOCUMENTS

| JP | 2016164287 A | 9/2016 |
| JP | 2019099882 A | 6/2019 |
| KR | 20140027458 A | 3/2014 |

OTHER PUBLICATIONS

International Search Report and Written Opinion of the International Search Report for application No. PCT/US2021/027126 dated Jul. 20, 2021.

*Primary Examiner* — Jason Berman
(74) *Attorney, Agent, or Firm* — Moser Taboada

(57) ABSTRACT

Embodiments of a process kits for use in a process chamber are provided herein. In some embodiments, a process kit for use in a multi-cathode processing chamber includes: a first rotatable shield coupled to a first shaft, wherein the first rotatable shield includes a base, a conical portion extending downward and radially outward from the base, and one or more holes formed through the conical portion, wherein no two holes of the one or more holes are diametrically opposed; and a second rotatable shield coupled to a second shaft concentric with the first shaft, wherein the second rotatable shield is disposed in the first rotatable shield, and wherein the first rotatable shield is configured to rotate independent of the first rotatable shield.

19 Claims, 5 Drawing Sheets

(56) References Cited

U.S. PATENT DOCUMENTS

2014/0102889 A1    4/2014  Kajihara et al.
2014/0374250 A1   12/2014  Ishihara
2018/0350572 A1*  12/2018  Wu ..................... H01J 37/3447

* cited by examiner

US 11,361,950 B2

MULTI-CATHODE PROCESSING CHAMBER WITH DUAL ROTATABLE SHIELDS

FIELD

Embodiments of the present disclosure generally relate to substrate processing equipment.

BACKGROUND

Various methods and apparatus for removing or building up material layers for semiconductor devices are known. Physical vapor deposition (PVD) chambers are often used in the semiconductor industry. PVD in semiconductor fabrication is typically performed with a target made of a desired film material. In the case of alloys, the targets are typically composed of the alloy to be sputtered. In the case of new nonvolatile memories, alloys of different compositions are used. As such, multiple targets in a multi-cathode (e.g., multi-target) PVD chamber have been utilized to deposit the different materials.

For deposition processes in a multi-cathode PVD chamber at low pressures (e.g., <1 mTorr), pressure may be increased to ignite a plasma and then reduced for the deposition processes. However, unwanted deposition on the substrate can occur during the time taken to reduce the pressure. Moreover, the different materials from the multiple targets may be deposited at the same time (i.e., co-sputtering). In addition, the multi-cathode PVD chamber may need to be opened to remove or replace hardware for sequential deposition of different materials onto the substrate.

Therefore, the inventors have provided embodiments of improved apparatus and methods of processing substrates.

SUMMARY

Embodiments of dual rotatable shields for use in a process chamber are provided herein. In some embodiments, dual rotatable shields for use in a multi-cathode processing chamber includes: a first rotatable shield coupled to a first shaft, wherein the first rotatable shield includes a base, a conical portion extending downward and radially outward from the base, and one or more holes formed through the conical portion, wherein no two holes of the one or more holes are diametrically opposed; and a second rotatable shield coupled to a second shaft concentric with the first shaft, wherein the second rotatable shield is disposed in the first rotatable shield, and wherein the first rotatable shield is configured to rotate independent of the first rotatable shield.

In some embodiments, a process kit for use in a multi-cathode processing chamber includes: a first rotatable shield coupled to a first shaft, wherein the first rotatable shield includes a base having a tubular body, a conical portion extending downward and radially outward from the tubular body, and one or more holes formed through the conical portion; and a second rotatable shield coupled to a second shaft concentric with the first shaft, wherein the second rotatable shield includes a second base disposed in the tubular body of the base of the first rotatable shield and a conical portion extending downward and radially outward from the second base, and wherein the first rotatable shield is configured to rotate independently of the first rotatable shield.

In some embodiments, a multi-cathode process chamber includes: a substrate support to support a substrate; a plurality of cathodes coupled to an upper portion of the multi-cathode process chamber and having a corresponding plurality of targets to be sputtered onto the substrate; and a process kit disposed within the multi-cathode processing chamber, wherein the process kit comprises: a first rotatable shield coupled to a first shaft, wherein the first rotatable shield includes a conical portion and one or more holes formed through the conical portion; and a second rotatable shield disposed in the conical portion of the first rotatable shield, wherein the second rotatable shield includes a second base and a conical portion extending downward and radially outward from the second base, wherein the second rotatable shield is coupled to a second shaft concentric with the first shaft, and wherein the first rotatable shield is configured to rotate independently of the first rotatable shield to selectively expose the substrate support to one or more cathodes of the plurality of cathodes.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
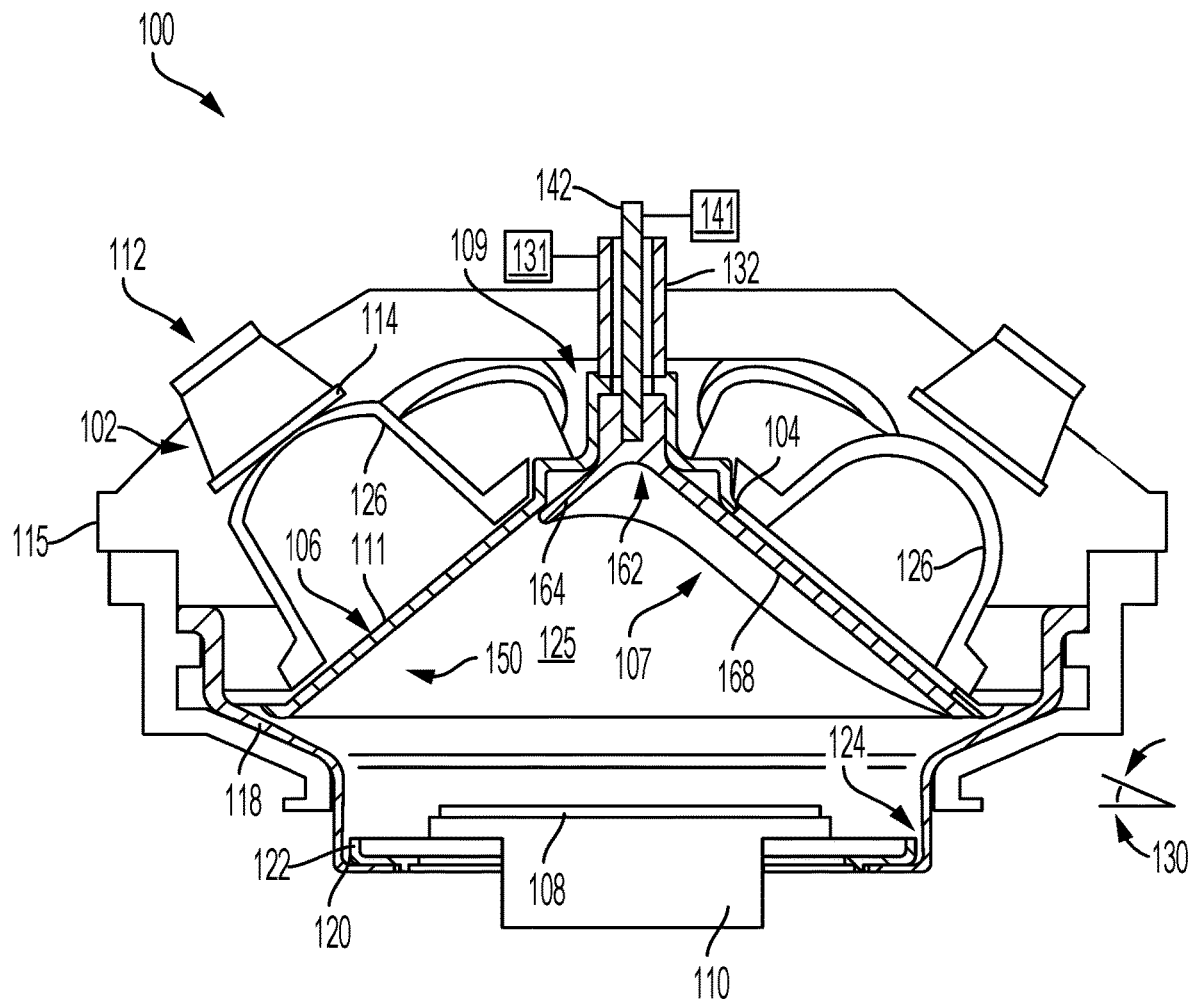
FIG. 1 depicts a schematic side view of a multi-cathode-PVD chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in ether embodiments without further recitation.

DETAILED DESCRIPTION

Embodiments of process kits for use in a multi-cathode-PVD chamber having multiple targets are provided herein. The process kits disclosed herein may advantageously minimize or eliminate cross-contamination between targets. In some embodiments, a multi cathode-PVD chamber includes a plurality of cathodes, or targets, (for example, 5 cathodes) attached to a top adapter. Each cathode can have a DC/Pulse, DC, or RF power supply based on the target material to be used and an associated magnetron. Each cathode also has a shroud which is long tube which does not block a line of sight from the target to wafer. The process kit includes a first rotatable shield provided in the center of the chamber that is shared by all the cathodes. Depending on the number of targets that need to be sputtered at the same time, the first rotatable shield can have one or more holes. The shroud surrounding each target advantageously captures a majority of the target flux that is not directed towards the wafer and hence likely to land on the wafer, thus significantly minimizing target cross-contamination. In some embodiments, the shroud material and surface treatment can be tailored to a specific target material being sputtered, thus improving defect performance.

In some embodiments, the process kit includes a second rotatable shield to act as a barrier layer to reduce or prevent unwanted deposition onto a substrate while the pressure is decreasing in the multi-cathode-PVD chamber. In some embodiments, the second, rotatable shield includes two or more holes that are selectively aligned or not aligned (i.e., offset) with the one or more holes of the first rotatable shield to selectively co-sputter desired materials from the multiple targets onto the substrate.

FIG. 1 depicts a schematic cross-sectional view of a multi-cathode-PVD chamber (process chamber 100) in accordance with some embodiments of the present disclosure. The process chamber 100 includes a plurality of cathodes 102 (e.g., five cathodes) coupled to an upper portion 115 of the process chamber 100 having a process kit 150 and a substrate support 110 disposed within and interior volume 125 of the process chamber 100 below the plurality of cathodes 102. In some embodiments, the substrate support 110 may be a rotating pedestal. In some embodiments, the substrate support 110 may be vertically movable.

The plurality of cathodes 102 can be used for sputtering different materials on a substrate 108. In some embodiments, the substrate 108 is a structure having a semiconductor material used for fabrication of integrated circuits. For example, the substrate 108 can represent a semiconductor structure including a wafer.

In some embodiments, the process kit 150 includes a first rotatable shield 106 to selectively cover one or more of the plurality of cathodes 102. In some embodiments, the first rotatable shield 106 includes a base 109, a conical portion 111 extending downward and radially outward from the base 109, and one or more holes 104 formed through the conical portion. In some embodiments, the conical portion 111 extends linearly downward and radially outward. The cathodes 102 are each exposed through the one or more holes 104 of the first rotatable shield 106, which is disposed over the substrate 108 on the substrate support 110. Materials from the cathodes 102 can be deposited onto the substrate 108 through one or more holes 104. In some embodiments, the first rotatable shield 106 is made of aluminum.

A power supply 112 may be coupled to each of the plurality of cathodes 102. The power supply 112 may include direct current (DC), pulsed DC, or radio frequency (RF) power. The first rotatable shield 106 may expose two or more of the plurality of cathodes 102 and shield the remaining cathodes from cross-contamination during sputtering. The cross-contamination results from physical movement or transfer of a deposition material from one of the cathodes 102 to another one of the cathodes 102. Each cathode 102 is positioned over a corresponding target 114. To sputter the selected target, the first rotatable shield 106 is rotated to expose the selected target to be sputtered. The targets 114 may be formed of any material desired to be sputtered onto the substrate 108.

The process kit 150 includes a second rotatable shield 107 disposed between the first rotatable shield 106 and the substrate support 110. In some embodiments, the second rotatable shield 107 is disposed in the conical portion 111 of the first rotatable shield 106. The second rotatable shield 107 includes a second base 162 and a conical portion 164 extending downward and radially outward from the base. In some embodiments, the conical portion 164 extends at an angle similar to the conical portion 111 of the first rotatable shield 106. In some embodiments, the second base 162 is disposed in the base 109. In some embodiments, as shown in FIG. 1, the conical portion 164 of the second rotatable shield 107 extends to a location between the second base 162 and the one or more holes 104 formed through the conical portion 111 of the first rotatable shield 106. In some embodiments, the second rotatable shield 107 includes a shutter portion 168 extending radially outward and downward from a portion of the conical portion 164, wherein the shutter portion 168 is sized to cover one of the one or more holes 104 of the first rotatable shield 106. In some embodiments, the second rotatable shield 107 is made of aluminum.

A first motor 131 is coupled to the first rotatable shield 106 via a first shaft 132 to facilitate the rotation of the first rotatable shield 106. A second motor 141 is coupled to the second rotatable shield 107 via a second shaft 142 concentric with the first shaft 132. In some embodiments, the second shaft 142 is disposed within a central opening of the first shaft 132. The second rotatable shield 107 is configured to rotate independent of the first rotatable shield 106.

In some embodiments, the Process kit 150 further includes a shroud 126, which is a long tube that does not block a line of sight from the target 114 to a substrate disposed on the substrate support 110, corresponding to each cathode 102. Each shroud 126 is angled with respect to a plane of the substrate support 110 to provide the cathodes 102 at an angle 130 of about 20 to 90 degrees. Different values of the angle 130 provide different uniformity profiles on a surface of the substrate. The angle 130 is measured between a plane of one of the targets 114 and a plane of the substrate support 110. In some embodiments, the angle 130 is about 30 degrees. In some embodiments, the angle 130 is alternatively about 40 degrees. Each shroud is configured to capture a majority of the target flux that is not directed towards and hence likely to land on the substrate 108. As such, each shroud 126 significantly minimize target cross contamination. Additionally, the shroud material and surface treatment of the shroud may be tailored to specific target materials, thus improving defect performance.

In some embodiments, the process kit 150 further includes a conical shield 118 and a cover ring 120. As depicted in FIG. 1, a top section of the conical shield 118 is configured to surround a lower portion of the first rotatable shield 106 and a bottom section of the conical shield 118 is configured to surround the substrate support 110. Before the substrate 108 moves into or out of the chamber, the substrate 108 can move below the conical shield 118 disposed on a lower portion of the process chamber 100. A cover ring 120 is disposed on top of the conical shield 118 and surrounds the substrate 108. When the substrate, support 110 moves down, the substrate 108 can be lifted up with a robotic arm (not shown) before the substrate 108 moves out of the chamber.

The cover ring 120 can include a ring portion 122 that curves up and has a predefined thickness to form a dish or bowl in which the substrate can be disposed with the ring portion 122 surrounding and disposed above the substrate 108. The cover ring 120 can also include a predefined gap 124 and a predefined length with respect to the conical shield 118. Thus, when materials are deposited on the substrate 108, the materials are prevented or substantially prevented from depositing below the substrate support 110 or outside of the conical shield 118. Controlling the deposition of materials as described advantageously prevents or reduces the spread of contaminants to the substrate 108 or within the process chamber.

Figure 2A:
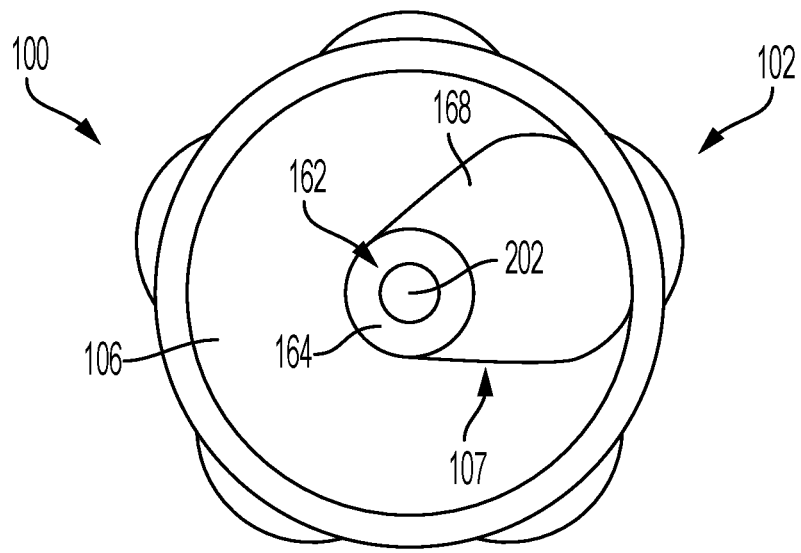
FIG. 2A depicts a process kit component in a first position in accordance with some embodiments of the present disclosure.
Figure 2B:
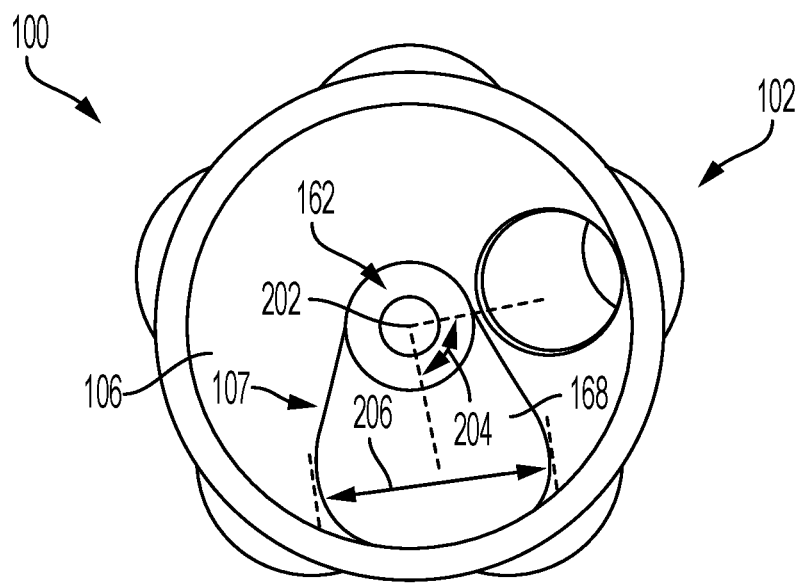
FIG. 2B depicts a process kit component in a second Position in accordance with some embodiments of the present disclosure.

FIGS. 2A and 2B depict a second rotatable shield 107 in a first position and a second position, respectively, in accordance with some embodiments of the present disclosure, To ignite a plasma for low pressure deposition processes within the process chamber 100, a pressure in the interior volume 125 may be initially increased (e.g., by flowing more process gas) to ignite a plasma in or proximate the shroud 126 and then the pressure may be reduced to a desired pressure (e.g., <1 mTorr) for the low pressure deposition process. However, unwanted deposition on the substrate 108 can occur during the time taken to reduce the pressure to the desired pressure. In some embodiments, the second rotatable shield 107 advantageously may be rotated to the first position to selectively cover the one or more holes 104 of the first rotatable shield 106 to prevent unwanted deposition onto the substrate 108 while the process chamber 100 is pressuring down. The second rotatable shield 107 may be rotated to the second position to expose the substrate 108 to the cathodes 102 through the one or more holes 104 of the first rotatable shield 106.

In some embodiments, as shown in FIGS. 2A and 2B, the one or more holes 104 of the first rotatable shield 106 comprises a single hole. In some embodiments, the second rotatable shield 107 is configured to rotate about a central axis 202 to cover the single hole of the one or more holes 104. The central axis 202 is the axis of rotation of the first shaft 132 and the second shaft 142. The second rotatable shield 107 rotates at an angle 204 with respect to the central axis 202 to go from the first position to the second position. In some embodiments, the angle 204 is about 80 degrees to about 120 degrees.

In some embodiments, the shutter portion 168 of the second rotatable shield 107 is sized to selectively cover the single one of the one or more holes 104 of the first rotatable shield 106. In some embodiments, the shutter portion 168 increases in width 206 as the shutter portion 168 extends radially outward and downward from the conical portion 164. In some embodiments, the shutter portion 168, from the conical portion 164 to a radially outermost portion of the shutter portion 168, increases in width 206 and then decreases in width 206.

Figure 3:
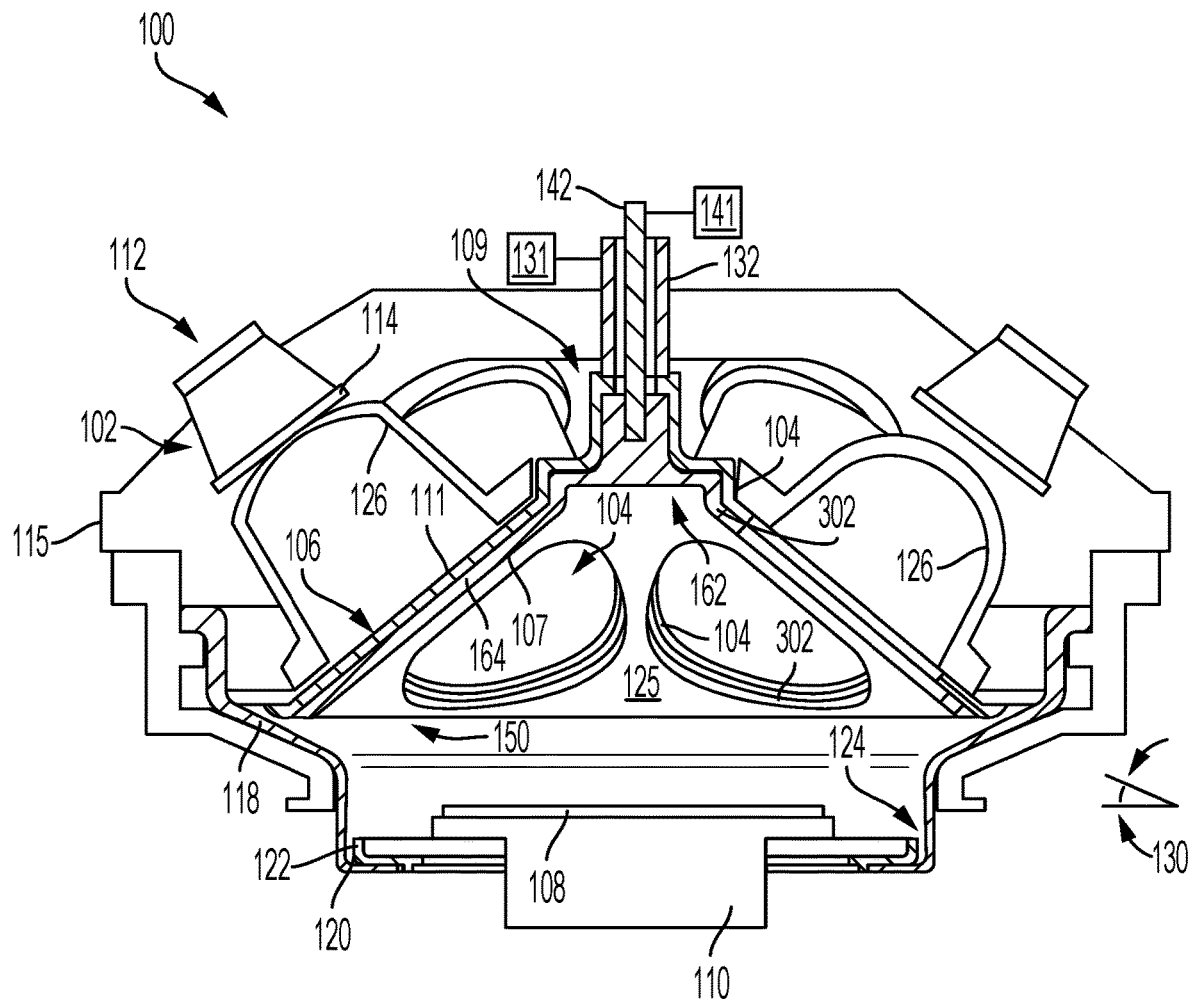
FIG. 3 depicts a schematic side view of a multi-cathode-PVD chamber in accordance with some embodiments of the present disclosure.

FIG. 3 depicts a schematic side view of a multi-cathode-PVD chamber (process chamber 100) in accordance with some embodiments of the present disclosure. In some embodiments, the second rotatable shield 107 includes two or more holes 302 that are selectively aligned or not aligned (i.e., offset) with the one or more holes 104 of the first rotatable shield to selectively co-sputter desired materials from the multiple targets 114 onto the substrate 108. In some embodiments, the one or more holes 302 of the second rotatable shield 107 are formed through the conical portion 164. In some embodiments, as shown in FIG. 3, the conical portion 164 of the second rotatable shield 107 extends from the second base 162 to a location beyond the one or more holes 104 formed through the conical portion 111 of the first rotatable shield 106.

In some embodiments, the one or more holes 104 of the first rotatable shield 106 are not arranged symmetrically, That is, when the first rotatable shield 106 is rotated 180 degrees with respect to the central axis 202, the positions of the one or more holes 104 do not match the positions before rotation. In some embodiments, no two holes of the one or more holes 302 are diametrically opposed. In some embodiments, the one or more holes 302 of the second rotatable shield 107 are not arranged symmetrically. That is, when the second rotatable shield 107 is rotated 180 degrees with respect to the central axis 202, the positions of the one or more holes 302 do not match the positions before rotation. In some embodiments, no two holes of the one or more holes 302 are diametrically opposed.

Figure 4:
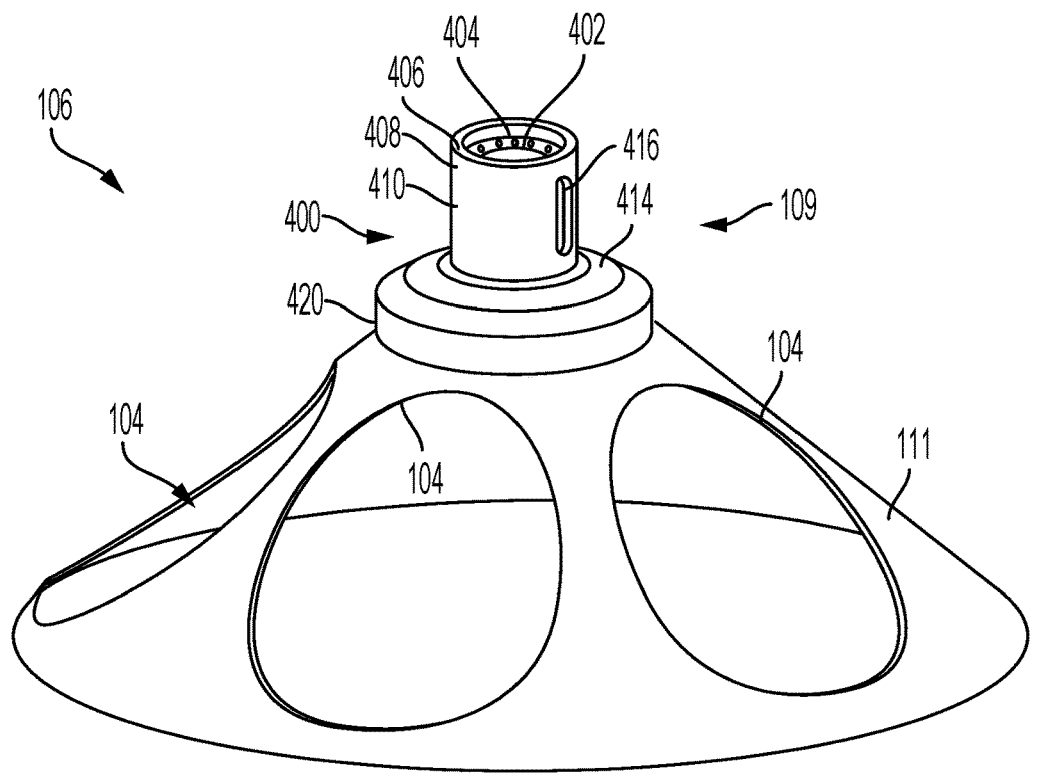
FIG. 4 depicts an isometric view of a first rotatable shield in accordance with some embodiments of the present disclosure.

FIG. 4 depicts an isometric view of the first rotatable shield 106 in accordance with some embodiments of the present disclosure. In some embodiments, the first rotatable shield 106 includes the base 109 and the conical portion 111 extending downward and radially outward from the base 109. In some embodiments, the base 109 includes an upper portion 400 having a tubular body 410 covered with a cap 406. In some embodiments, a hole 402 is formed in the cap 406 to allow the second shaft 142 to pass through the cap 406 and to facilitate the rotation of the second rotatable shield 107. In some embodiments, the cap 406 includes a recessed surface 404 about the hole 402 to accommodate the first shaft 132. In some embodiments, the recessed surface 404 includes a plurality of holes to secure the first rotatable shield 106 to the first shaft 132 to impart rotation from the first shaft 132 to the first rotatable shield 106.

In some embodiments, the base 109 includes a ledge 414 extending radially outward from a lower surface of the tubular body 410. In some embodiments, the base 109 includes a leg 420 extending downward from an outer edge of the ledge 414 to the conical portion 111 of the first rotatable shield 106. In, some embodiments, an outer surface of the leg 420 is concentric with an outer surface 408 of the tubular body 410. In some embodiments, the tubular body 410 includes a cutout 416 extending through the outer surface 408 to provide side access to a volume within the tubular body 410.

In some embodiments, the one or more holes 104 of the first rotatable shield 106 are egg-shaped to correspond to a shape of the shroud 126. In some embodiments, the one or more holes 104 of the first rotatable shield 106 are circular or oval shaped. In some embodiments, the one or more holes 104 of the first rotatable shield 106 is three holes. In some embodiments, the three holes of the one or more holes 104 are arranged to correspond with three adjacent cathodes 102.

Figure 5:
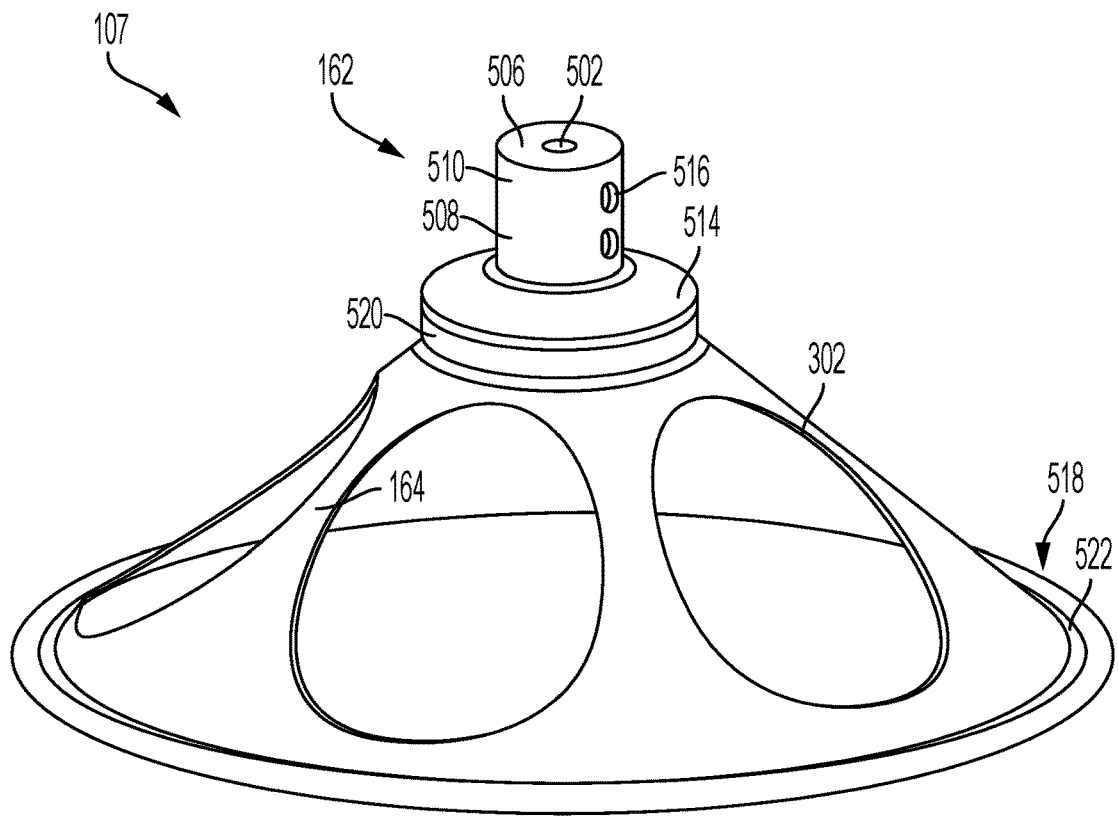
FIG. 5 depicts an isometric view of a second rotatable shield in accordance with some embodiments of the present disclosure.

FIG. 5 depicts an isometric view of the second rotatable shield 107 in accordance with some embodiments of the present disclosure. In some embodiments, the second rotatable shield 107 is sized to cover two or more holes of the one or more holes 104 of the first rotatable shield 106. In some embodiments, the one or more holes 302 of the second rotatable shield 107 may be two or three holes to expose one or more cathodes 102. In some embodiments, as shown in FIG. 5, the one or more holes 302 of the second rotatable shield 107 comprise three holes. In some embodiments, the three holes of the one or more holes 302 are arranged to correspond with three adjacent cathodes 102. In some embodiments, the one or more holes 302 of the second rotatable shield 107 are the same shape as the one or more holes 104 of the first rotatable shield 106. In some embodiments, the one or more holes 104 of the first rotatable shield 106 comprises the same number of holes as the one or more holes 302 of the second rotatable shield 107.

In some embodiments, the second rotatable shield 107 includes the second base 162 and the conical portion 164 extending downward and radially outward from the second base 162. In some embodiments, the second base 162 includes an upper portion 510. In some embodiments, the upper portion 510 is shaped to fit within the tubular body 410 of the first rotatable shield 106. In some embodiments, the upper portion 510 has a cylindrical shape. In some embodiments, a mating opening 502 is formed on an upper surface 506 of the upper portion 510 to receive the second shaft 142 to facilitate the rotation of the second rotatable shield 107. In some embodiments, the mating opening 502 extends only partially through the second base 162. In some embodiments, the mating opening 502 has a shape corresponding to the second shaft 142 and is configured to impart rotation from the second shaft 142 to the second rotatable shield 107. In some embodiments, the mating opening 502 is shaped to prevent the second shaft 142 from slipping within the mating opening 502 and rotating relative to the second rotatable shield 107.

In some embodiments, the second base 162 includes a ledge 514 extending radially outward from a lower surface of the upper portion 510. In some embodiments, the second base 162 includes a leg 520 extending downward from an outer edge of the ledge 514 to the conical portion 164 of the second rotatable shield 107. In some embodiments, an outer surface of the leg 520 is concentric with an outer surface of the upper portion 510. In some embodiments, the upper portion 510 includes one or more holes 516 extending from the outer surface 508 to the mating opening 502 to secure the second shaft 142 to the second rotatable shield 107. In some embodiments, the cutout 416 of the first rotatable shield 106 is advantageously aligned with the one or more holes 516 to provide access to the one or more holes 516 through the first rotatable shield 106.

In some embodiments, the second rotatable shield 107 includes a collar portion 518 extending radially outward from a bottom of the conical portion 164. In some embodiments, an upper surface of the collar portion 518 includes an annular recess 522 maintain a gap between the second rotatable shield 107 and a lower surface of the first rotatable shield 106.

In use, the plurality of holes 104 of the first rotatable shield 106 and, plurality of holes 302 of the second rotatable shield 107 advantageously may be oriented in any manner to expose one or more of the cathodes 102. The first rotatable shield 106 and the second rotatable shield 107 facilitate multiple sputter or co-sputtering processes within the process chamber 100 without having to vent the process chamber 100 or replace any component, which increase throughput and reduces contamination of the substrate 108. In some embodiments, the first rotatable shield 106 and the second rotatable shield 107 are configured to expose one cathode 102 in a first configuration, two cathodes 102 in a second configuration, or three cathodes 102 in a third configuration.

Figure 6A:
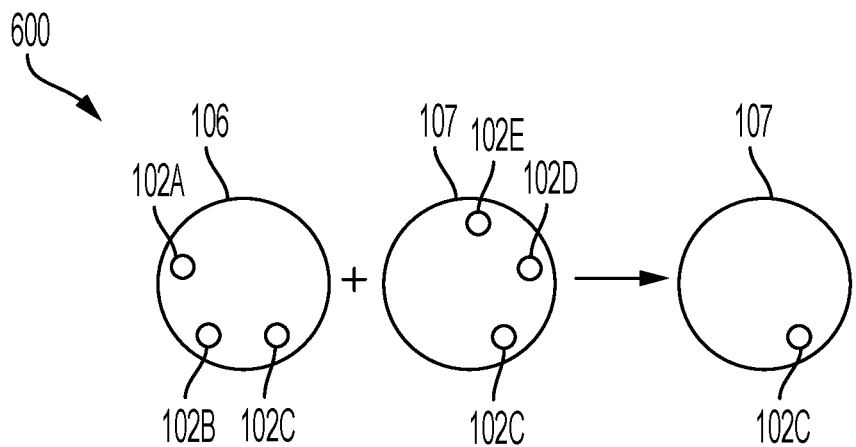
FIG. 6A depicts a schematic view of a process kit in a first configuration in accordance with some embodiments of the present disclosure.

FIG. 6A depicts a schematic view of a process kit in an exemplary first configuration 600 in accordance with some embodiments of the present disclosure. In some embodiments, the process chamber 100 includes five cathodes 102 (e.g., cathodes 102A-102E). In some embodiments, the first rotatable shield 106 is oriented to expose cathodes 102A, 102B, and 102C (e.g., oriented to align holes 104 with cathodes 102A, 102B, and 102C) and the second rotatable shield 107 is oriented to expose cathodes 102C, 102D, and 102E (e.g., oriented to align holes 302 with cathodes 102C, 102D, and 102E). In such embodiments, the first rotatable shield 106 and the second rotatable shield 107 overlap to expose cathode 102C in the exemplary first configuration 600 (e.g., only one hole in each shield are aligned to provide a single continuous opening completely through the first rotatable shield 106 and the second rotatable shield 107). Similarly, by controlling rotational position of the shields, the first rotatable shield 106 and the second rotatable shield 107 may be oriented to expose any one of the cathodes 102A-102E.

Figure 6B:
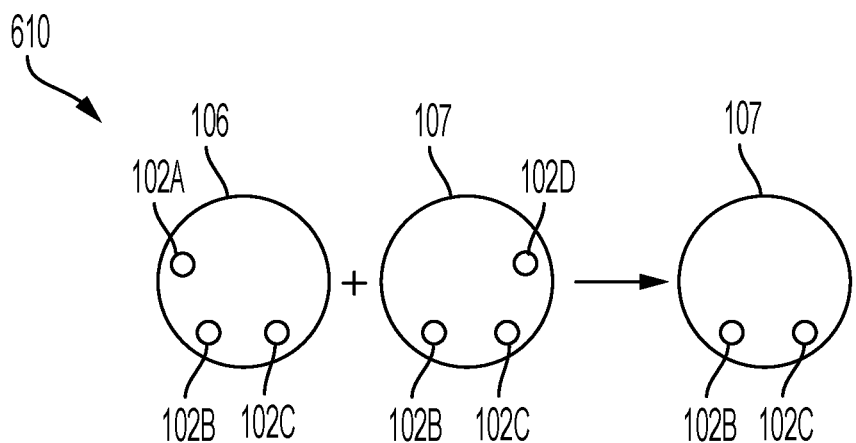
FIG. 6B depicts a schematic view of a process kit in a second configuration in accordance with some embodiments of the present disclosure.

FIG. 6B depicts a schematic view of a process Kit in an exemplary second configuration 610 in accordance with some embodiments of the present disclosure. In some embodiments, the first rotatable shield 106 is oriented to expose cathodes 102A, 102B, and 102C (e.g., oriented to align holes 104 with cathodes 102A, 102B, and 102C) and the second rotatable shield 107 is oriented to expose cathodes 1028, 102C, and 102D (e.g., oriented to align holes 302 with cathodes 1028, 102C, and 102D). In such embodiments, the first rotatable shield 106 and the second rotatable shield 107 overlap to expose cathodes 102B and 102C in the exemplary second configuration 610 (e.g., two holes in each shield are aligned to provide a single continuous opening completely through the first rotatable shield 106 and the second rotatable shield 107). Similarly, by controlling rotational position of the shields, the first rotatable shield 106 and the second rotatable shield 107 may be oriented to expose any two adjacent cathodes of the cathodes 102A-102E to co-sputter two materials.

Figure 6C:
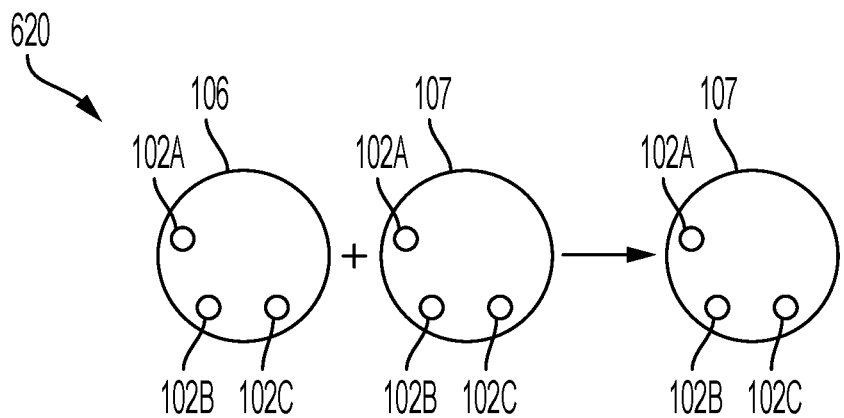
FIG. 6C depicts a schematic view of a process kit in a third configuration in accordance with some embodiments of the present disclosure.

FIG. 6C depicts a schematic view of a process kit in an exemplary third configuration 620 in accordance with some embodiments of the present disclosure. In some embodiments, the first rotatable shield 106 is oriented to expose cathodes 102A, 102B, and 102C (e.g., oriented to align holes 104 with cathodes 102A, 1028, and 102C) and the second rotatable shield 107 is oriented to expose cathodes 102A, 102B, and 102C (e.g., oriented to align holes 302 with cathodes 102A, 102B, and 102C). In such embodiments, the first rotatable shield 106 and the second rotatable shield 107 overlap to expose cathodes 102A, 102B, and 102C in the exemplary third configuration 620 (e.g., three holes in each shield are aligned to provide a single continuous opening completely through the first rotatable shield 106 and the second rotatable shield 107). Similarly, by controlling rotational position of the shields, in the third configuration 620, the first rotatable shield 106 and the second rotatable shield 107 may be oriented to expose any three adjacent cathodes of the cathodes 102A-102E to co-sputter three materials.

While the foregoing is directed to embodiments of the present disclosure, other and further embodiments of the disclosure may be devised without departing from the basic scope thereof.

The invention claimed is:

1. A process kit for use in a multi-cathode processing chamber, comprising:
 a first rotatable shield coupled to a first shaft, wherein the first rotatable shield includes a base, a conical portion extending downward and radially outward from the base, and one or more holes formed through the conical portion, wherein no two holes of the one or more holes are diametrically opposed; and
 a second rotatable shield coupled to a second shaft concentric with the first shaft, wherein the second rotatable shield is disposed in the first rotatable shield, and wherein the first second rotatable shield is configured to rotate independent of the first rotatable shield,
wherein the second rotatable shield includes a collar portion extending radially outward from a bottom of the second rotatable shield, and
wherein the collar portion includes an annular recess configured to maintain a gap between the second rotatable shield and a lower surface of the first rotatable shield.

2. A process kit for use in a multi-cathode processing chamber, comprising:
a first rotatable shield coupled to a first shaft, wherein the first rotatable shield includes a base, a conical portion extending downward and radially outward from the base, and single hole formed through the conical portion; and
a second rotatable shield coupled to a second shaft concentric with the first shaft, wherein the second rotatable shield is disposed in the first rotatable shield, and wherein the second rotatable shield is configured to rotate independent of the first rotatable shield, wherein the second rotatable shield is sized to selectively cover the single hole of the first rotatable shield, wherein the second rotatable shield has a shutter portion that increases and then decreases in width as the shutter portion extends radially outward and downward toward a bottom of the first rotatable shield.

3. The process kit of claim 1, wherein the base includes an upper portion having a tubular body covered with a cap, and wherein the second shaft extends through a hole in the cap.

4. The process kit of claim 1, wherein the second rotatable shield includes a second base and a conical portion extending downward and radially outward from the second base.

5. The process kit of claim 4, wherein the second rotatable shield includes one or more holes formed through the conical portion.

6. The process kit of claim 5, wherein the one or more holes of the first rotatable shield comprises a same number of holes as the one or more holes of the second rotatable shield.

7. The process kit of claim 6, wherein the one or more holes of the first rotatable shield is three holes that are not arranged symmetrically.

8. The process kit of claim 1, wherein the second rotatable shield is sized to cover one or more holes of the one or more holes of the first rotatable shield.

9. A process kit for use in a multi-cathode processing chamber, comprising:
a first rotatable shield coupled to a first shaft, wherein the first rotatable shield includes a base having a tubular body, a conical portion extending downward and radially outward from the tubular body, and one or more holes formed through the conical portion; and
a second rotatable shield coupled to a second shaft concentric with the first shaft, wherein the second rotatable shield includes a second base disposed in the tubular body of the base of the first rotatable shield and a conical portion extending downward and radially outward from the second base, and wherein the second rotatable shield is configured to rotate independently of the first rotatable shield,
wherein the second rotatable shield includes a collar portion extending radially outward from a bottom of the second rotatable shield, and
wherein the collar portion includes an annular recess configured to maintain a gap between the second rotatable shield and a lower surface of the first rotatable shield.

10. The process kit of claim 9, wherein the second rotatable shield includes a shutter portion extending radially outward and downward from a portion of the conical portion, wherein the shutter portion is sized to cover one of the one or more holes of the first rotatable shield.

11. The process kit of claim 10, wherein the one or more holes of the first rotatable shield is a single hole.

12. The process kit of claim 9, wherein the conical portion of the second rotatable shield extends from the second base to a location beyond the one or more holes formed through the conical portion of the first rotatable shield.

13. The process kit of claim 9, wherein the second rotatable shield includes one or more holes configured to selectively align with a corresponding one or more holes of the first rotatable shield.

14. A multi-cathode process chamber, comprising:
a substrate support to support a substrate;
a plurality of cathodes coupled to an upper portion of the multi-cathode process chamber and having a corresponding plurality of targets to be sputtered onto the substrate; and
a process kit disposed within the multi-cathode processing chamber, wherein the process kit is as described in claim 1
such that rotation of the first rotatable shield and the second rotatable shield can selectively expose the substrate support to one or more cathodes of the plurality of cathodes.

15. The multi-cathode process chamber of claim 14, further comprising a plurality of shrouds configured to be disposed about the plurality of targets and between the plurality of targets and the first rotatable shield.

16. The multi-cathode process chamber of claim 14, further comprising a conical shield, wherein a top section of the conical shield is configured to surround a lower portion of the first rotatable shield, and wherein a bottom section of the conical shield is configured to surround the substrate support.

17. The multi-cathode process chamber of claim 16, further comprising a cover ring configured to rest on the bottom section of the conical shield.

18. The multi-cathode process chamber of claim 14, wherein the second rotatable shield includes a plurality of holes comprising three holes that are configured to selectively align with two or three holes of the first rotatable shield to selectively expose two or three adjacent cathodes of the plurality of cathodes.

19. The multi-cathode process chamber of claim 14, wherein the second rotatable shield includes one or more holes formed through the conical portion.

* * * * *